United States Patent
Zientara et al.

(10) Patent No.: US 12,135,048 B2
(45) Date of Patent: Nov. 5, 2024

(54) PISTON LIMIT SENSING FOR FLUID APPLICATION

(71) Applicant: Wagner Spray Tech Corporation, Plymouth, MN (US)

(72) Inventors: Daniel Robert Zientara, Lakeville, MN (US); Lam Huu Nguyen, Woodbury, MN (US); Fei Wu, Baltimore, MD (US)

(73) Assignee: Wagner Spray Tech Corporation, Plymouth, MN (US)

( * ) Notice: Subject to any disclaimer, the term of this patent is extended or adjusted under 35 U.S.C. 154(b) by 91 days.

(21) Appl. No.: 16/123,680

(22) Filed: Sep. 6, 2018

(65) Prior Publication Data
US 2019/0072118 A1   Mar. 7, 2019

Related U.S. Application Data

(60) Provisional application No. 62/555,280, filed on Sep. 7, 2017.

(51) Int. Cl.
*F15B 15/28* (2006.01)
*B05B 9/04* (2006.01)
(Continued)

(52) U.S. Cl.
CPC ........ *F15B 15/2807* (2013.01); *B05B 9/0409* (2013.01); *B05B 9/0413* (2013.01);
(Continued)

(58) Field of Classification Search
CPC ..... B05B 9/007; B05B 9/0409; B05B 9/0413; B05B 12/004; F04B 9/08; F04B 9/105;
(Continued)

(56) References Cited

U.S. PATENT DOCUMENTS

| | | | | |
|---|---|---|---|---|
| 3,195,043 A | * | 7/1965 | Burig | G01D 5/147 324/235 |
| 3,776,252 A | | 12/1973 | Wilcox | |

(Continued)

FOREIGN PATENT DOCUMENTS

| | | |
|---|---|---|
| CN | 103221893 A | 7/2013 |
| CN | 203476918 U | 3/2014 |

(Continued)

OTHER PUBLICATIONS

Final Office Action for U.S. Appl. No. 15/468,611, dated Aug. 25, 2020, 16 pages.

(Continued)

*Primary Examiner* — Kenneth J Hansen
*Assistant Examiner* — Joseph S. Herrmann
(74) *Attorney, Agent, or Firm* — Christopher J. Volkmann; Kelly, Holt & Christenson, PLLC.

(57) ABSTRACT

A liquid delivery system includes a source of hydraulic fluid and a hydraulic cylinder fluidically coupled to the source of hydraulic fluid and having a hydraulic piston movable between first and second limit positions. The liquid delivery system includes a rod connected to the piston and extending out of the hydraulic cylinder and a sensor device located outside the hydraulic cylinder and configured to sense a position of the rod and to generate a signal indicating the sensed position. The liquid delivery system includes a liquid cylinder comprising a liquid piston, operably driven by the rod, to pump a liquid along a flow path to a fluid applicator.

15 Claims, 12 Drawing Sheets

(51) Int. Cl.
| | |
|---|---|
| *B05B 12/00* | (2018.01) |
| *F04B 9/08* | (2006.01) |
| *F04B 9/105* | (2006.01) |
| *F04B 15/02* | (2006.01) |
| *F04B 17/06* | (2006.01) |
| *F04B 49/06* | (2006.01) |
| *F15B 13/044* | (2006.01) |
| *G01R 33/07* | (2006.01) |
| *B05B 9/00* | (2006.01) |

(52) U.S. Cl.
CPC .............. *B05B 12/004* (2013.01); *F04B 9/08* (2013.01); *F04B 9/105* (2013.01); *F04B 15/02* (2013.01); *F04B 17/06* (2013.01); *F04B 49/065* (2013.01); *F15B 13/044* (2013.01); *G01R 33/07* (2013.01); *B05B 9/007* (2013.01); *F04B 2201/0201* (2013.01)

(58) Field of Classification Search
CPC ........ F04B 15/02; F04B 17/06; F04B 49/065; F04B 2201/0201; F15B 13/044; F15B 15/2807; G01R 33/07; G01D 5/142; G01D 5/145; G01D 5/147; G01D 5/165
USPC .................... 324/207.2, 207.22, 207.24, 251
See application file for complete search history.

(56) References Cited

U.S. PATENT DOCUMENTS

| | | | |
|---|---|---|---|
| 4,028,473 A * | 6/1977 | Conti .................... | B05B 9/0409 427/434.7 |
| 4,030,857 A | 6/1977 | Smith, Jr. | |
| 4,035,109 A * | 7/1977 | Drath .................... | F01L 25/063 417/403 |
| 4,047,591 A | 9/1977 | Ward | |
| 4,119,113 A | 10/1978 | Meginniss, III | |
| 4,195,970 A | 4/1980 | Zalis | |
| 4,310,143 A | 1/1982 | Determan | |
| 4,355,280 A | 10/1982 | Duzich | |
| 4,435,626 A | 3/1984 | Coffin | |
| 4,475,346 A | 10/1984 | Young | |
| 4,494,677 A | 1/1985 | Falcoff | |
| 4,526,053 A | 7/1985 | Carson | |
| 4,531,491 A | 7/1985 | Iiyama et al. | |
| 4,628,499 A | 12/1986 | Hammett | |
| 4,684,062 A * | 8/1987 | Bagwell ................ | E01C 19/174 239/1 |
| 4,701,112 A | 10/1987 | Eisenhut et al. | |
| 4,715,012 A | 12/1987 | Mueller, Jr. | |
| 4,785,615 A | 11/1988 | Leigh-Monstevens | |
| 4,787,481 A | 11/1988 | Farrar | |
| 4,853,629 A * | 8/1989 | Rops ...................... | G01B 7/003 324/207.2 |
| 4,990,058 A * | 2/1991 | Eslinger ................ | F04B 9/113 417/18 |
| 4,994,984 A * | 2/1991 | Massimo ............... | B67D 7/303 222/71 |
| 5,115,194 A * | 5/1992 | Luetzow ................ | G01B 7/023 324/174 |
| 5,139,044 A | 8/1992 | Otten et al. | |
| 5,154,532 A * | 10/1992 | Schaefer ............... | F04B 53/147 403/301 |
| 5,201,838 A * | 4/1993 | Roudaut ................ | B25J 13/088 294/206 |
| 5,305,917 A | 8/1994 | Miller | |
| 5,346,037 A | 9/1994 | Flaig et al. | |
| 5,367,944 A | 11/1994 | Akeel et al. | |
| 5,435,697 A | 7/1995 | Guebeli et al. | |
| 5,557,154 A | 9/1996 | Erhart | |
| 5,725,358 A | 3/1998 | Bert et al. | |
| 6,017,200 A | 1/2000 | Childs et al. | |
| 6,074,170 A | 6/2000 | Bert | |
| 6,135,719 A | 10/2000 | Yoder et al. | |
| 6,168,387 B1 | 1/2001 | Able et al. | |
| 6,205,853 B1 | 3/2001 | Dei et al. | |
| 6,212,997 B1 * | 4/2001 | McCollough ......... | F04B 53/144 417/554 |
| 6,868,774 B2 * | 3/2005 | McCollough ........... | F04B 9/125 403/300 |
| 7,170,385 B2 * | 1/2007 | LaClair ................ | H03K 17/9505 336/208 |
| 7,467,927 B2 | 12/2008 | Wood | |
| 7,581,935 B2 * | 9/2009 | Hofmann .............. | F04B 7/0241 417/28 |
| 7,737,685 B2 | 6/2010 | Low et al. | |
| 7,744,354 B2 | 6/2010 | Lilie | |
| 8,215,922 B2 | 6/2012 | Berger | |
| 8,424,596 B2 | 4/2013 | Bebb | |
| 8,668,464 B2 | 3/2014 | Kensy | |
| 8,823,509 B2 * | 9/2014 | Hyland ................. | G08B 25/10 340/539.22 |
| 8,845,298 B2 | 9/2014 | Larsen | |
| 8,997,628 B2 | 4/2015 | Sall et al. | |
| 9,140,247 B2 | 9/2015 | Herre | |
| 9,677,549 B2 | 6/2017 | Bauck et al. | |
| 9,752,701 B2 | 9/2017 | Dubus et al. | |
| 2002/0028103 A1 | 3/2002 | Frank | |
| 2004/0238661 A1 | 12/2004 | Schroeder et al. | |
| 2005/0024207 A1 * | 2/2005 | Schebel ................ | G08B 13/08 340/539.1 |
| 2005/0146252 A1 | 7/2005 | Chuang | |
| 2005/0231192 A1 | 10/2005 | Ketelaars et al. | |
| 2006/0245942 A1 | 11/2006 | Hofmann et al. | |
| 2008/0187449 A1 | 8/2008 | Breidenbach | |
| 2008/0203189 A1 | 8/2008 | Cho et al. | |
| 2010/0163638 A1 | 7/2010 | Herre et al. | |
| 2010/0301134 A1 | 12/2010 | Anderton et al. | |
| 2011/0020143 A1 | 1/2011 | Van Brunt et al. | |
| 2011/0044830 A1 | 2/2011 | Scott | |
| 2012/0262159 A1 | 10/2012 | Pellin et al. | |
| 2013/0142672 A1 | 6/2013 | Blackson | |
| 2014/0035563 A1 * | 2/2014 | Tan ....................... | B29C 45/2806 324/207.2 |
| 2014/0138399 A1 * | 5/2014 | Estelle .................. | F04B 49/065 222/1 |
| 2014/0234122 A1 | 8/2014 | Donohoe et al. | |
| 2015/0192431 A1 | 7/2015 | Jonsjord | |
| 2015/0217312 A1 | 8/2015 | Hines | |
| 2016/0102685 A1 | 4/2016 | Chester | |
| 2016/0169223 A1 * | 6/2016 | Paul ...................... | F04B 9/12 417/63 |
| 2016/0222995 A1 * | 8/2016 | Zientara ............... | B05B 9/0409 |
| 2017/0199513 A1 * | 7/2017 | Zientara ............... | F04B 49/06 |

FOREIGN PATENT DOCUMENTS

| | | |
|---|---|---|
| EP | 1 536 135 A2 | 6/2005 |
| EP | 1460393 B1 | 8/2013 |
| EP | 3250824 A1 | 12/2017 |
| WO | WO 03/006173 A1 | 1/2003 |
| WO | WO 2004010096 A1 | 1/2004 |
| WO | WO 2004/038440 A1 | 5/2004 |
| WO | WO/2004/103888 A2 | 5/2005 |
| WO | WO2007/115631 A1 | 10/2007 |
| WO | WO/2009/127051 A1 | 10/2009 |
| WO | WO 2013/178579 A1 | 12/2013 |

OTHER PUBLICATIONS

Notice of Allowance for U.S. Appl. No. 15/468,611, dated Nov. 3, 2020, 7 pages.
Final Office Action for U.S. Appl. No. 15/005,169 dated Nov. 27, 2018, 24 pages.
Non-Final Office Action for U.S. Appl. No. 15/005,169 dated Apr. 8, 2019, 25 pages.
International Preliminary Report for International Patent Application No. PCT/US2017/032084, date of mailing: Jan. 3, 2019, date of filing: May 11, 2017, 10pages.
Final Office Action for U.S. Appl. No. 15/468,611 dated Aug. 30, 2019, 12 pages.

(56) References Cited

OTHER PUBLICATIONS

Final Ofice Action for U.S. Appl. No. 15/005,169 dated Aug. 29, 2019, 29 pages.
Amendment for U.S. Appl. No. 15/005,169 dated Aug. 8, 2019, 12 pages.
Second Office Action for Chinese Patent Application No. 201680005583.4 dated Dec. 25, 2018, 17 pages.
Amendment for U.S. Appl. No. 15/468,611 dated May 29, 2019, 12 pages.
Amendment filed for U.S. Appl. No. 15/468,611 dated May 20, 2020, 12 pages.
Non-Final Office Action for U.S. Appl. No. 15/468,611 dated Mar. 13, 2019, 14 pages.
Third Office Action for Chinese Patent Application No. 201680005583.4 dated Apr. 19, 2019, 19 pages with English Translation.
Extended Search Report for European Patent Application No. 17815861.4 dated Nov. 29, 2019. 7 pages.
Extended European Search Report for European Application No. 16743926.4 dated Sep. 13, 2018, 11 pages.
Amendment with RCE filed for U.S. Appl. No. 15/005,169 dated Feb. 25, 2019, 12 pages.
Non-Final Office Action for U.S. Appl. No. 15/468,611 dated Mar. 2, 2020, 14 pages.
Amendment with RCE for U.S. Appl. No. 15/468,611 dated Dec. 2, 2019, 15 pages.
Article 94 for European Patent Application No. 16743926.4 dated Sep. 4, 2019, 5 pages.
First Office Action for Chinese Patent Application No. 201780037405.4 dated Jun. 19, 2020, 19 pages with English Translation.
International Preliminary Report on Patentability for International Patent Application No. PCT/US2018/049866, mailing date of: Mar. 19, 2020, 12 pages.
Youtube video, "Graco HFR Hydraulic Actuator," https://www.youtube.com/watch?v=bDOw6rMnOCM, Published Apr. 15, 2012.
Youtube video, "Graco Hydraulic Pump Operation.wmv," https://www.youtube.com/watch?v=C7T5JuoXIVE, Published Jan. 31, 2013.
International Search Report and Written Opinion for International Patent Application No. PCT/US2016/014818, date of mailing: May 24, 2016, date of filing: Jan. 26, 2016, 16 pages.
Prosecution History for U.S. Appl. No. 15/005,169 including: Non-Final Office Action dated Apr. 10, 2018, and Application and Drawings filed Jan. 25, 2016, 41 pages.
Amendment for U.S. Appl. No. 15/005,169 dated Jul. 10, 2018, 9 pages.
First Office Action for Chinese Patent Application No. 201680005583.4 dated Jul. 2, 2018, 20 pages.
International Search Report for International Patent Application No. PCT/2017032084, date of mailing: Aug. 23, 2017, date of filing: May 11, 2017, 13 pages.
International Search Report and Written Opinion for International Patent Application No. PCT/US2018/049866, date of mailing: Dec. 18, 2018, date of filing: Sep. 7, 2018, 18 pages.
Second Office Action for Chinese Patent Application No. 201780037405.4 dated Jan. 6, 2021, 17 pages with English Translation.
First Office Action for Chinese Patent Application No. 201880057749.6 dated Nov. 24, 2020, 17 pages with English Translation.
Extended Search Report for European Patent Application No. 18852935.8 dated Mar. 10, 2021, 8 pages.
Communication Pursuant to Article 94(3) for European Patent Application No. 17815861.4 dated Jan. 31, 2022, 6 pages.
Second Office Action for Chinese Patent Application No. 201880057749.6 dated Aug. 4, 2021, 18 pages with English Translation.
Communication Pursuant to Article 94(3) for EP Patent Application No. 16743926.4 dated Nov. 25, 2021, 7 pages.
Rejection Decision for Chinese Patent Application No. 201880057749.6 dated Mar. 3, 2022, 17 pages with English Translation.

\* cited by examiner

PISTON LIMIT SENSING FOR FLUID APPLICATION

CROSS-REFERENCE TO RELATED APPLICATION

The present application is based on and claims the benefit of U.S. provisional patent application Ser. No. 62/555,280, filed Sep. 7, 2017, the content of which is hereby incorporated by reference in its entirety.

BACKGROUND

Liquid delivery systems are used to deliver fluid from a source location to a delivery location. In some instances, liquid delivery systems include a pump system configured to provide the liquid at a desired operational pressure. Liquid delivery systems are useful for a variety of fluids, for example paints, primers, and other exemplary fluids.

SUMMARY

Figure 1:
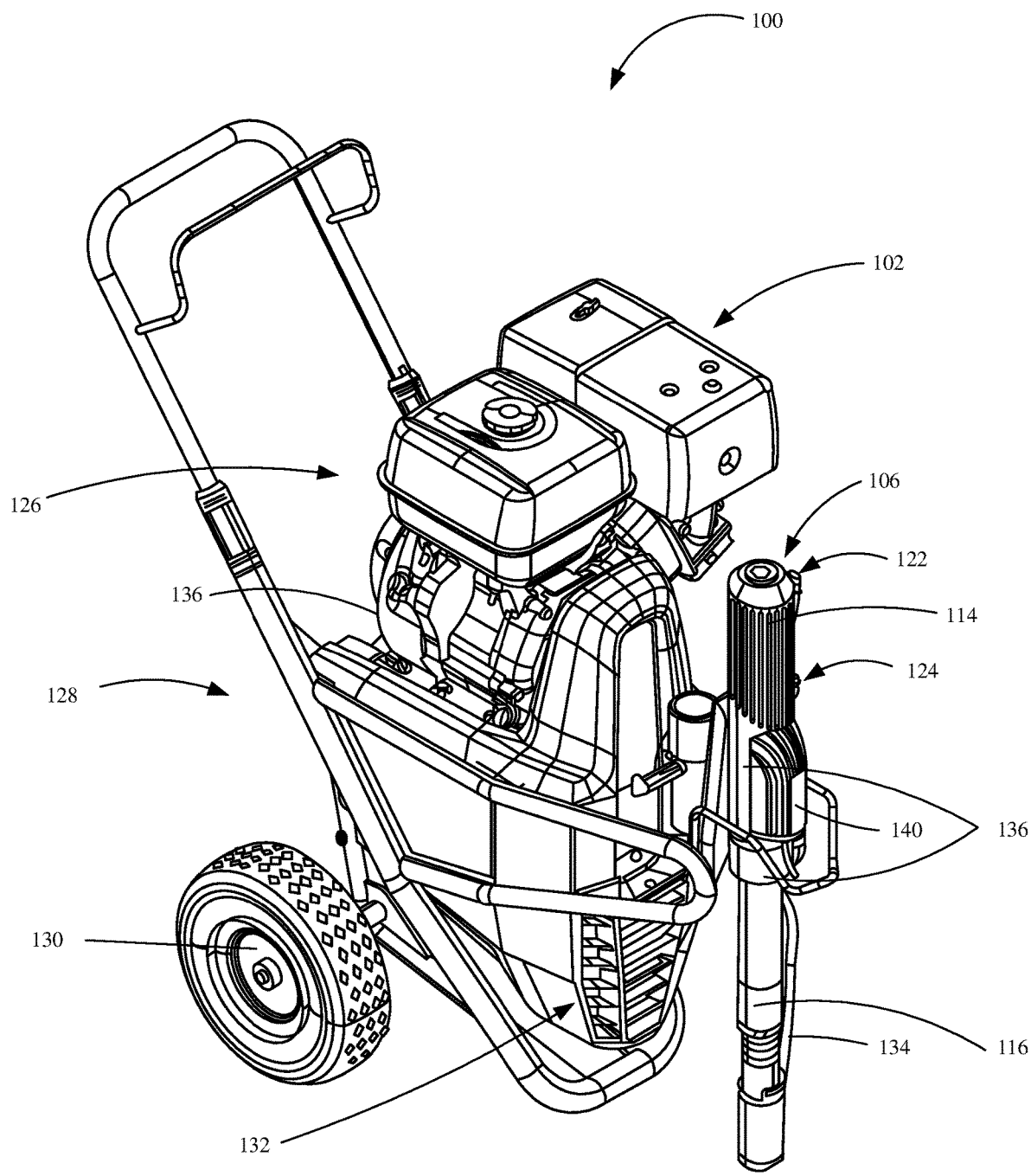
FIG. 1 is a perspective view showing one example of a painting system.

A liquid delivery system includes a source of hydraulic fluid and a hydraulic cylinder fluidically coupled to the source of hydraulic fluid and having a hydraulic piston movable between first and second limit positions. The liquid delivery system includes a rod connected to the piston and extending out of the hydraulic cylinder and a sensor device located outside the hydraulic cylinder and configured to sense a position of the rod and to generate a signal indicating the sensed position. The liquid delivery system includes a liquid cylinder comprising a liquid piston, operably driven by the rod, to pump a liquid along a flow path to a fluid applicator.

The above summary is not intended to describe each illustrated embodiment or every implementation of the present disclosure

DETAILED DESCRIPTION

Aspects of the present disclosure relate to hydraulic powered liquid pumps, more particular aspects relate to the sensors within a limit sensing system used to determine the position of a piston in a liquid delivery system, and control and charging thereof. While the present disclosure is not necessarily limited to such applications, various aspects of the disclosure may be appreciated through a discussion of various examples using paint as context.

Many fluid applicators, particularly paint applicators, are subject to significant wear and tear over their lifetime. For hydraulic applicators, which traditionally include cables to charge limit position sensors and communication with a controller, the wear and tear can present risk of damage to these cables. For example, if the cables are cut, or exposed to a degrading solvent, the sensors may no longer function properly. It is desired to have a system that wirelessly charges sensors, and facilitates wireless communication between the controller and sensor system.

It is also desired for a system to, in real time, detect a piston speed, direction, and location within a stroke. While many current systems detect when a piston travels past a sensor (or reaches a stroke limit), it is desired to have a system that detects the position of the piston mid-stroke. For example, in plural component systems, where ratios between two different components are important to product quality, a system should detect and monitor a real-time position of a piston throughout each stroke.

Additionally, it is desired for a system to have wireless communication enabled between the limit sensors and the controller. Wireless communication can also allow for delivery of detected information to a remote device. For example, if a controller detects, while monitoring piston position and speed, abnormal behavior, the behavior can be reported. In some cases, the controller can also report a diagnosis, for example that a seal may be failing, as indicated by a faster-than-normal downstroke or a slower upstroke.

According to various examples, the liquid delivery system can include a hydraulic cylinder. The hydraulic cylinder can be a mechanical actuator that distributes a force on a liquid using reciprocating piston strokes. The piston is connected to a piston rod or other suitable structure and movement of the piston causes the reciprocal movement of the piston rod. The cylinder is closed on one end by a cylinder top (hereinafter referred to as the head) and on the other end by a cylinder bottom (hereinafter referred to as the base) where the piston rod comes out of the cylinder. In a hydraulic powered liquid delivery system, the hydraulic cylinder derives its power from a pressurized hydraulic fluid. In certain examples, an actuator (e.g., a solenoid valve) can direct the hydraulic fluid flow generated by a hydraulic pump through a first port (e.g., a port near the head hereinafter referred to as the head port) located on the cylinder. As the hydraulic fluid is directed by the actuator to the head port, pressure builds in the cylinder to force the piston to move from the head, through the cylinder, and to the base.

FIG. 1 is a perspective view showing one example painting system 100. Painting system 100 that includes an upper shroud 126, a frame 128, wheels 130, a lower shroud 132, a motor system 102, a solenoid valve (not shown in FIG. 1) under the lower shroud 132, a pump assembly 106, a hydraulic motor 136, and a paint reservoir (not shown). Motor system 102 can be electrically powered, gas powered, etc. and can include a hydraulic pump under lower shroud 132 and a hydraulic fluid reservoir (not shown in FIG. 1) also under lower shroud 132. The hydraulic pump delivers hydraulic fluid (e.g., oil) from the hydraulic fluid reservoir to the solenoid valve. The solenoid valve can be an electromechanical device that includes a solenoid, a head port on the valve body and a rod port on the valve body. The head port on the valve body and the rod port on the valve body can be controlled by an electric current through the solenoid. For the solenoid valve, the electric current can alternate the flow from the head port on the valve body and the rod port on the valve body.

As shown, the solenoid is coupled to a controller 140. Controlling 140 can include a variety of different hardware and/or software components. In one example, the controller comprises a MOSFET and flip-flop integrated circuit system. In another example, the solenoid is controlled by a computer processor and integrated software, for example a circuit board. The circuit board can be communicably coupled, directly to the solenoid. The controller can also be coupled to a memory, such that the controller can report, or store, collected information from a cycle counter and/or a run-time tracker. The controller can be useful to measure performance of the pump system without manual cycle counting. In some examples, as discussed in greater detail below, the controller can also monitor a piston speed and derive an instantaneous position of the piston within a stroke. As shown controller 140 is on pump assembly 106, however, controller 140 may be located elsewhere.

Pump assembly 106 includes a hydraulic cylinder 114 and a paint pump 116. The solenoid valve directs the hydraulic fluid, generated by the hydraulic pump, through the head port on the valve body to a head port 122 of hydraulic cylinder 114. As the hydraulic fluid is directed by the solenoid valve through head port 122 of hydraulic cylinder 114, pressure builds in the cylinder and forces the hydraulic piston to move. As the hydraulic piston moves through cylinder, the hydraulic fluid is forced through a rod port 124 of hydraulic cylinder 114, into the solenoid valve through the rod port on the valve body, and returned to the hydraulic fluid reservoir. In addition, a hydraulic piston rod (not shown in FIG. 1), connected to the hydraulic piston, can also be connected to a paint piston rod (not shown in FIG. 1). As a result, the hydraulic piston moves the paint piston rod through paint pump 116 to pump paint from the paint reservoir to an outlet hose 134 connected to a paint applicator (not shown in FIG. 1).

In one example, a ferrous collar is connected to the hydraulic piston rod. Moreover, at least two sensors are located outside the cylinder that correspond to the two limit positions of the hydraulic piston at each end of its stroke, hereinafter referred to as a stroke limit position. In certain examples, the sensor can be a hall effect sensor.

In one example, one or more limit sensors are coupled to a controller (not shown in FIG. 1). The controller may, using the one or more limit sensors, detect a position of the piston rod. Detecting a position of the piston rod, during start-up for example, may be helpful to start a normal operation loop. In some previous systems, uncertainty in piston-location can make starting a normal operation loop difficult. For example, the piston may be mid-stroke, topped out, bottomed out, etc. The software-controlled controller may be able to detect a location of the piston, and engage a corresponding operation loop.

The controller may also be configured to track cycles, for example by updating a cycle-rate count after each completed cycle, and run-time for the pump system. This may allow for calculation of performance parameters without adding additional hardware to the pump system to manually count cycles.

For example, as the hydraulic piston moves from the head port 122 through the cylinder to rod port 124, a ferrous metal located on the hydraulic piston rod moves closer to a first hall effect sensor at a stroke limit position. When the hydraulic piston has reached the stroke limit position in the cylinder, the ferrous metal would be detected by the first hall effect sensor (not shown in FIG. 1). In response to detecting the ferrous metal, the hall effect sensor sends a sensor signal to the controller 140. In an example using a MOSFET and flip-flop integrated circuit control system as a component of controller 140, controller 140 can provide a voltage or other suitable indication that activates a set of metal oxide semiconductor field effect transistors (MOSFETs) and flip-flop integrated circuit, or other suitable switching devices, to change the state of the solenoid. In another example, where controller 140 includes integrated software configured to change the state of the solenoid.

Once the solenoid state changes, the hydraulic fluid can now flow into the cylinder through rod port 124 of hydraulic cylinder 114. Moreover, the hydraulic fluid can be pushed back through head port 122 of hydraulic cylinder 114, into the solenoid valve, and returned to the hydraulic fluid reservoir. As the hydraulic piston moves through the cylinder in the opposite direction, (e.g., from the rod port 124 towards the head port 122) the magnetic field strength, with respect to the first hall effect sensor, decreases and the first hall effect sensor detects the change. When the hydraulic piston has reached a stroke limit position, ferrous metal located on the hydraulic piston rod, causes a second hall effect sensor to detect the position of the rod. Controller 140 receives a signal from the second hall effect and then reverse the hydraulic fluid flow from the solenoid valve.

Figure 2A:
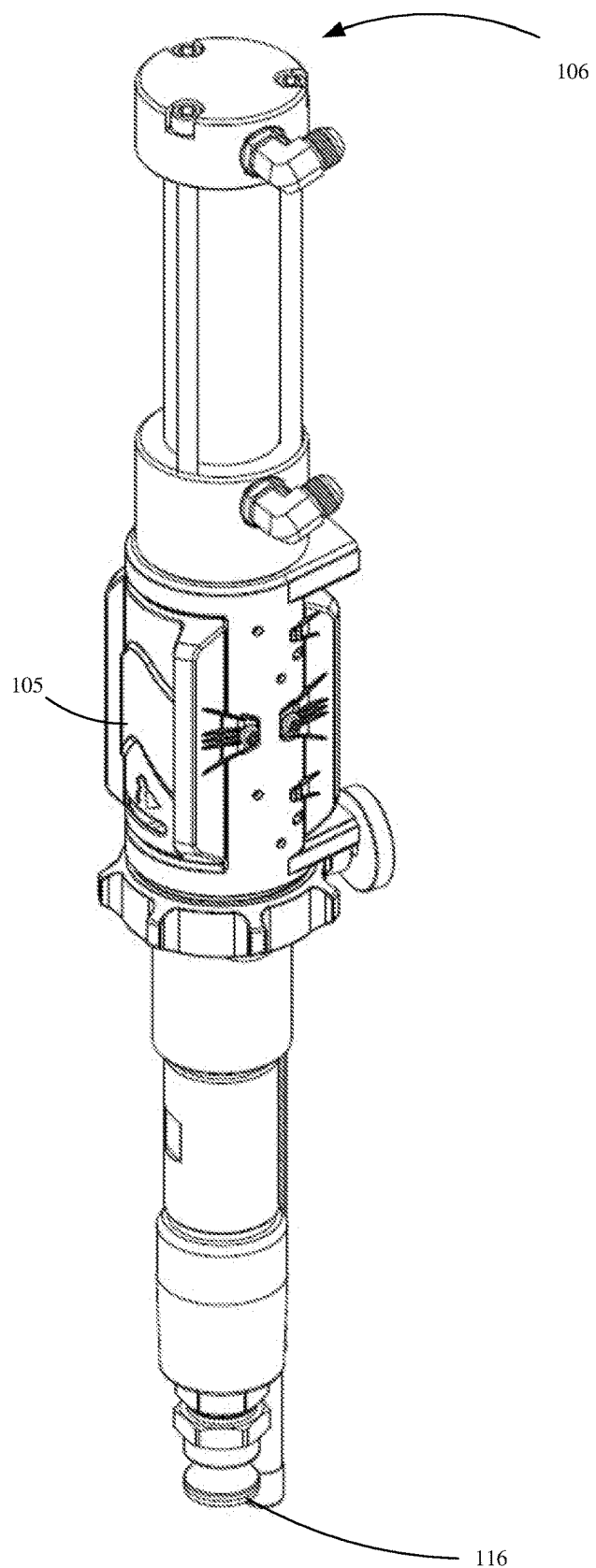
FIGS. 2A-2C are views of example pump assemblies.
Figure 2B:
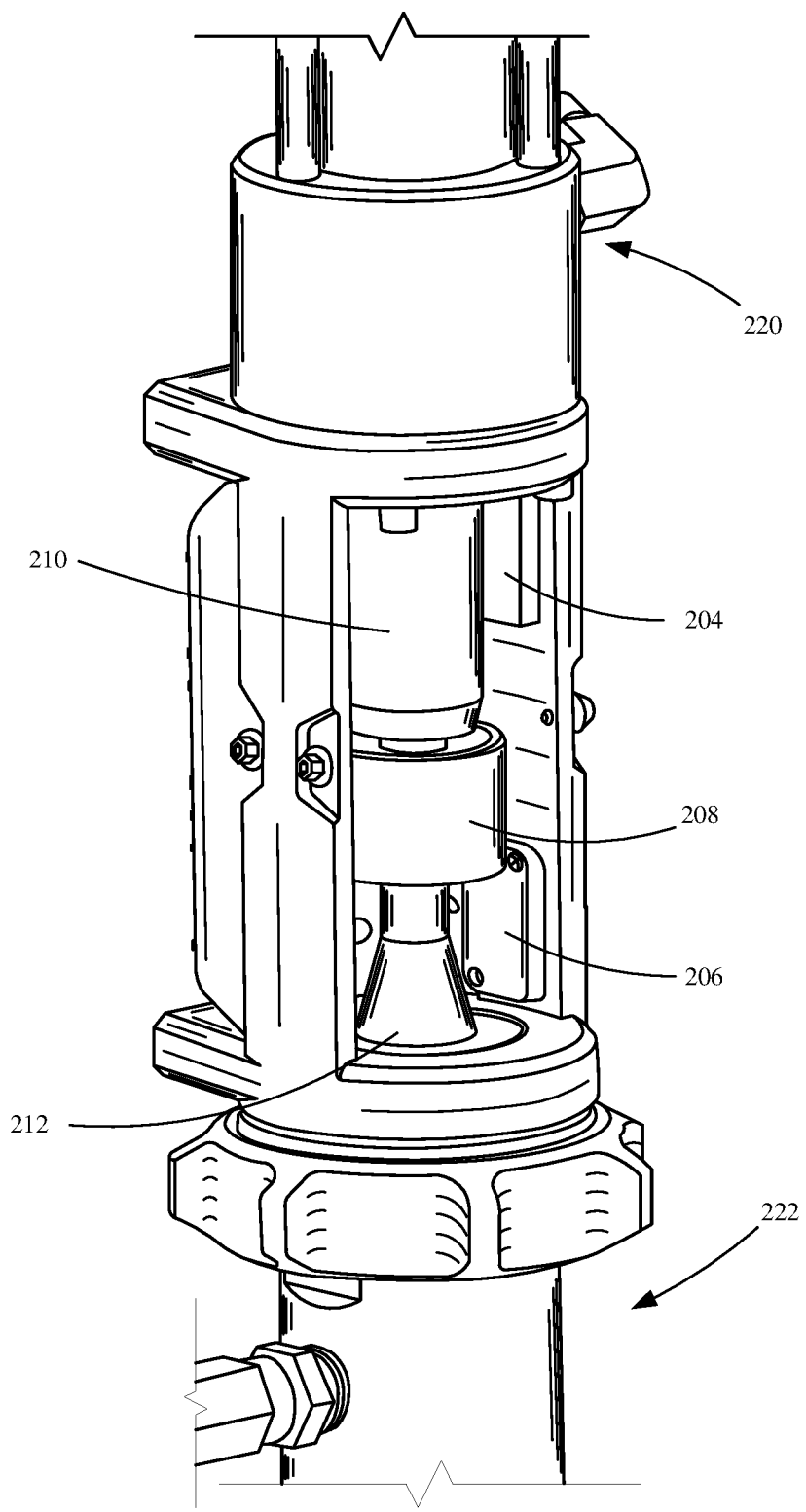
Figure 2C:
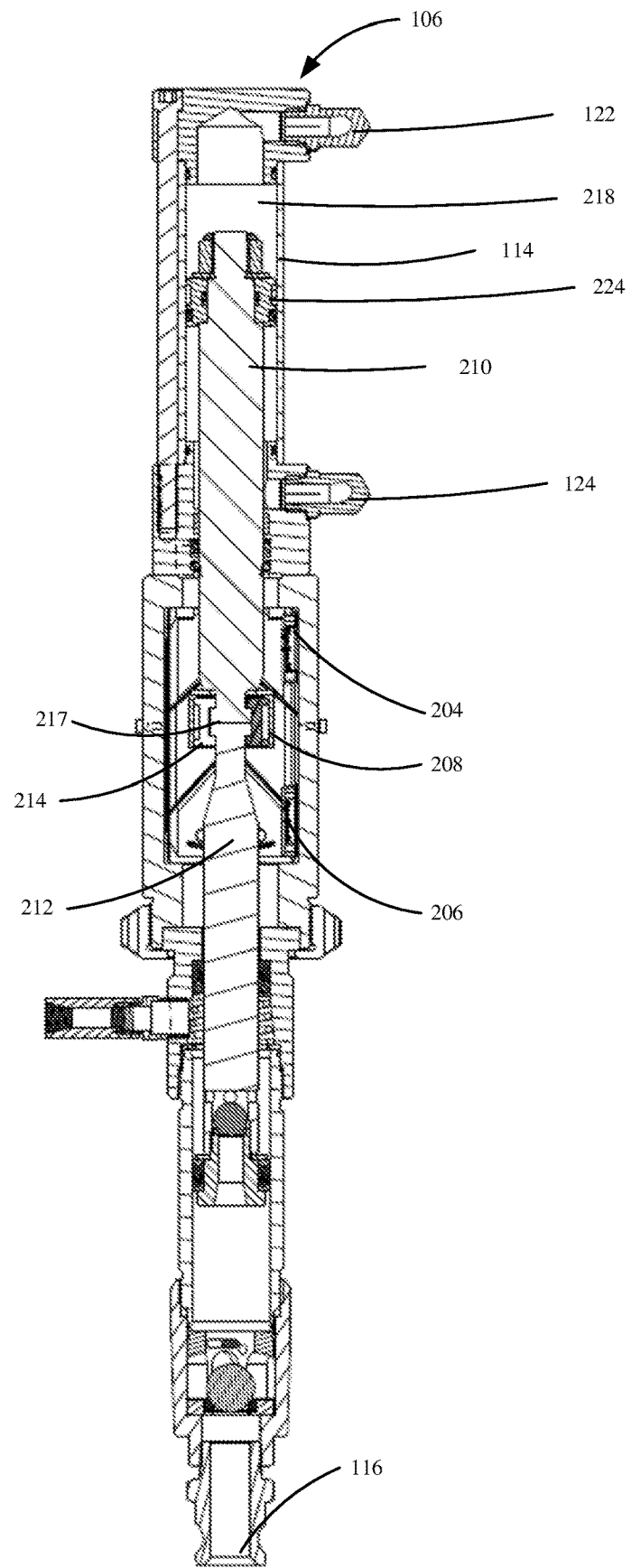

FIGS. 2A-2C show views of an example pump assembly. FIG. 2A is a front view of the pump assembly showing paint intake 116 and cover 105. FIG. 2B is a perspective view showing cover 105 removed. FIG. 2C is a cutaway view of pump assembly 106.

As can be seen in FIG. 2C, pump assembly 106 includes head port 122 of hydraulic cylinder 114, rod port 124 of hydraulic cylinder 114, a paint piston rod 212, a hydraulic piston rod 210, a hydraulic piston 224, a paint intake 216, a hydraulic cylinder cavity 218, a minimum sensor 204, maximum sensor 206, and sheath 208. An actuator (e.g., solenoid valve) directs a hydraulic fluid into hydraulic cylinder cavity 218 through head port 122 of hydraulic cylinder 114. The hydraulic fluid forces hydraulic piston 224 to move down through hydraulic cylinder cavity 218. As hydraulic piston 224 moves down through hydraulic cylinder cavity 218, paint piston rod 212 moves down through paint pump cavity and pushes paint out a hose outlet (e.g., through a hose to paint applicator). In addition, hydraulic fluid is forced back through rod port 124 of hydraulic cylinder 114, into the solenoid valve and returned to a hydraulic fluid reservoir.

In one example, when hydraulic piston 224 is at a stroke limit position, sheath 208 is proximate maximum sensor 206, and maximum sensor 206 generates a sensor signal indicative of the sheath 208 reaching the maximum position. In response to receiving the sensor signal, controller 140 reverses the state of the solenoid valve and causes the hydraulic fluid to flow into hydraulic cylinder cavity 218 through rod port 124 of hydraulic cylinder 114, thereby reversing the direction of piston 224. As piston 224 travels up, the hydraulic fluid is forced out of head port 122 of hydraulic cylinder 114, into the solenoid valve and returned to the hydraulic fluid reservoir. Paint piston rod 212 also moves up through the paint pump cavity and draws the paint in through paint intake 216 (shown in FIG. 2A). When the hydraulic piston has reached its upper stroke limit position, sheath 208 is sensed by minimum sensor 204 is reversed the hydraulic fluid flow into hydraulic cylinder cavity 218 through head port 122 of hydraulic cylinder 114.

Sheath 208 can include some type of ferrous metal or other material that can be detected by minimum sensor 204 or maximum sensor 206 to sense the stroke position of hydraulic rod 210 and paint pump rod 212. However, sheath 208 can serve other purposes as well.

For instance, collar 214 couples hydraulic rod 210 to paint pump rod 212. As shown, collar 214 includes two semi-circular pieces that fit over hydraulic rod 210 at interface 219 and paint pump rod 212 at interface 217. To keep the two pieces of collar 214 in contact with both the hydraulic rod 210 and paint pump rod 212, sheath 208 can be fit over the exterior surface of collars 214 to inhibit lateral movement of the collar 214 relative to the stroke direction of hydraulic rod 210 and paint pump rod 212. In some examples, there may be a greater or lesser number of pieces to collar 214.

An integrated software controller may allow for parameter-tracking of performance metrics of pump assembly 106. For example, the integrated software controller may comprise a cycle counter configured to track total cycles and run-time over the operational lifetime of pump assembly 106.

FIG. 2B is a perspective view of an open pump coupling assembly. As shown in FIG. 2B, cover 105 has been removed to expose minimum sensor 204, maximum sensor 206, sheath 208, hydraulic rod 210 and paint piston rod 212. Minimum sensor 204 and maximum sensor 206 sense the location of sheath 208. Sheath 208 is coupled to and couples hydraulic rod 210 to paint pump rod 212, and hence, the location of sheath 208 is indicative of the positions of hydraulic rod 210 and paint pump rod 212. Therefore, when the minimum sensor 204 or the maximum sensor 206 detects sheath 208, the sensor output is also indicative of the hydraulic rod 210 and paint pump rod 212 reaching a stroke limit.

As shown, minimum sensor 204 and maximum sensor 206 are hall effect sensors that can detect the change in an electromagnetic field. For instance, both minimum sensor 204 and maximum sensor 206 include a magnet that generates a magnetic field. When sheath 208 comes into close proximity with the magnet, the magnetic field changes in a detectable way. This change is indicative of the sheath being at either location proximate the minimum sensor 204 or maximum sensor 206. The locations of minimum sensor 204 and maximum sensor 206 can be relative to sheath 208, in such a way, that when sheath 208 reaches either sensor, the hydraulic rod 210 and/or paint pump rod 212 is either at their maximum or minimum stroke position.

Figure 3A:
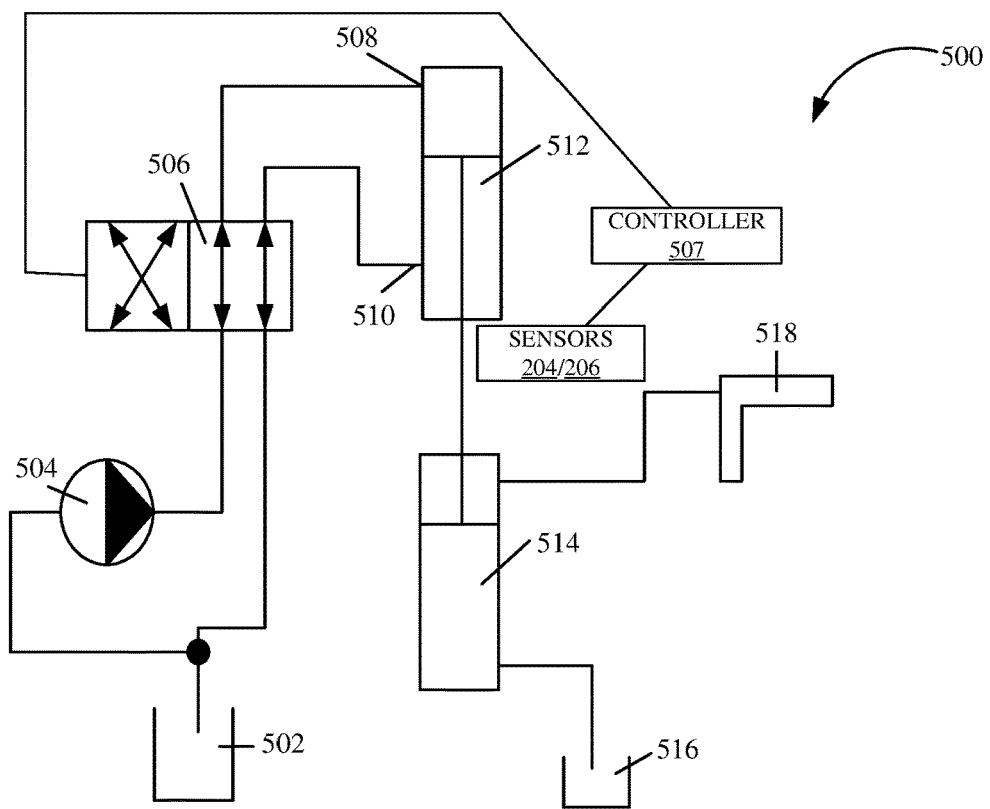
FIGS. 3A-B are diagrams showing example hydraulic circuits.

FIG. 3A is a diagram showing one example of a hydraulic circuit. Hydraulic circuit 500 can include a hydraulic reservoir 502 can include a hydraulic reservoir 502, a hydraulic pump 504, a solenoid 506, a head port 508, a rod port 510, a hydraulic cylinder 512, a paint cylinder 514, a paint reservoir 516, and a spray gun 518. Hydraulic pump 504 can pump hydraulic fluid from hydraulic reservoir 502 to solenoid 506. In FIG. 3, solenoid 506 is illustrated as a directional control valve. Directional control valves can allow fluid to flow into different paths from one or more sources. They can consist of a spool inside a cylinder and can be mechanically, electrically, and/or hydraulically controlled. Moreover, the movement of the spool can restrict or permit the flow of the hydraulic fluid from hydraulic reservoir 502. As illustrated in FIG. 3A, solenoid 506 can be operably coupled to a controller 507 and controller 507 can be operably coupled to sensors 204 and 206.

An electromechanical solenoid can operate a 4-way, 2 position valve since there are 2 spool positions and 4 valve ports. However, other position valves can be used. The 4-way, 2 position valve combined with the controller 507 and hall effect sensors (e.g. sensors 204 and 206) (not shown in FIG. 4) enables fast switching between the down stroke and the up stroke of hydraulic cylinder 512. This allows hydraulic circuit 500 to achieve a consistent paint pressure. In this example, initially, head port 508 is the pressure port which is connected to hydraulic pump 504 and the rod port is connected to hydraulic reservoir 502. As the hydraulic fluid is directed into head port 508 the pressure inside hydraulic cylinder 512 forces the hydraulic piston to move down through hydraulic cylinder 512 and the hydraulic fluid is pushed out rod port 510 and back to hydraulic reservoir 502. Since hydraulic piston is attached to the paint piston, the paint piston also moves down through paint cylinder 514 and paint, located in the paint cylinder, is pushed into spray gun 518.

In one example, when the hydraulic piston has reached a stroke limit position, the corresponding hall effect sensor (e.g., sensor 206) can provide a signal to a controller 507 that activates a set of MOSFETs and flip-flop integrated circuit (not shown in FIG. 3), causing solenoid 506 to slide the spool to its second position. As a result, rod port 510 is the pressure port which is connected to hydraulic pump 504 and the head port is connected to hydraulic reservoir 502. As the hydraulic fluid is directed into rod port. 510 the pressure inside hydraulic cylinder 512 forces the hydraulic piston to move up through hydraulic cylinder 512 and the hydraulic fluid is pushed out the head port and back to hydraulic reservoir 502. Moreover, the paint piston also moves up through paint cylinder 514 and paint from paint reservoir 516 can be drawn up into paint cylinder 517.

In another example, solenoid 506 is controlled by an integrated software controller (not shown in FIG. 3), communicably coupled to solenoid 506. An integrated software controller may be useful to locate a position of the piston is detectable prior to start-up of the pump assembly.

Figure 3B:
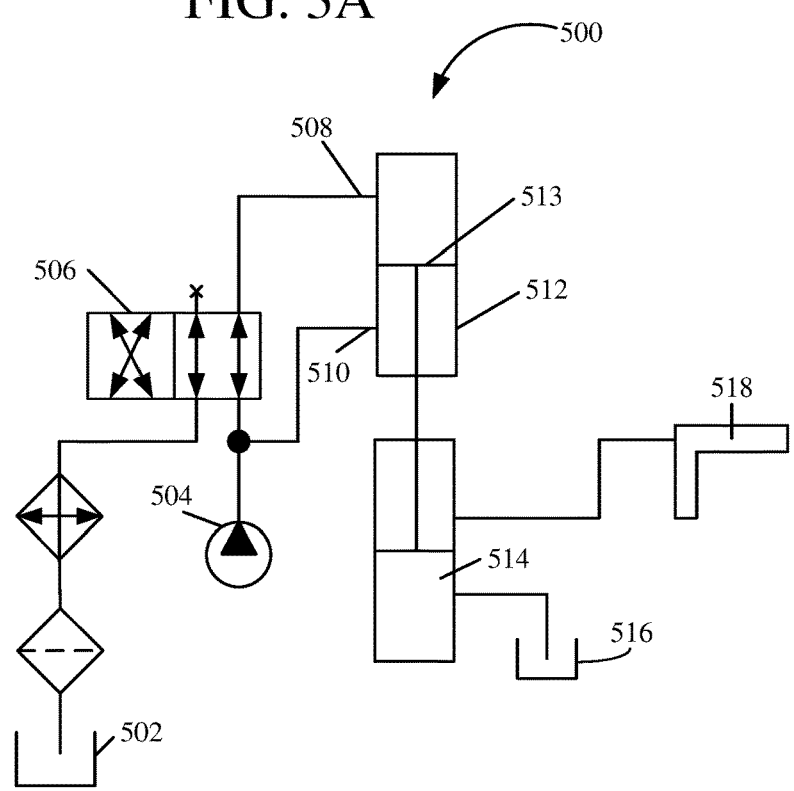

FIG. 3B is a diagram showing one example of a hydraulic circuit. FIG. 3B is similar to FIG. 3A and similar components are similarly numbered. However, in FIG. 3B the rod port-side of cylinder 512 has direct pump pressure. Also, in FIG. 3B, the solenoid 506 includes a two-way valve alternating pump pressure to the head side of cylinder 512.

In the down stroke (e.g., when solenoid 506 is in the open position) the rod and head side of cylinder 512 both have pressure and the piston 513 moves down because the annual arca on the head side is greater than the rod side. In the retraction stroke (e.g., when solenoid 506 is in the closed position) there is pump pressure on the rod side only and the head side is returning to tank and low pressure. In one example, the difference in annual area between the head side of piston 513 and the rod side of piston 513 is substantially a 2:1 ratio. This can result in equal extension force and retraction force. Equalizing extension force and retraction force is important in keeping fluid section pressure equal in the extension and retraction stroke to maintain a consistent spray pattern.

Figure 4A:
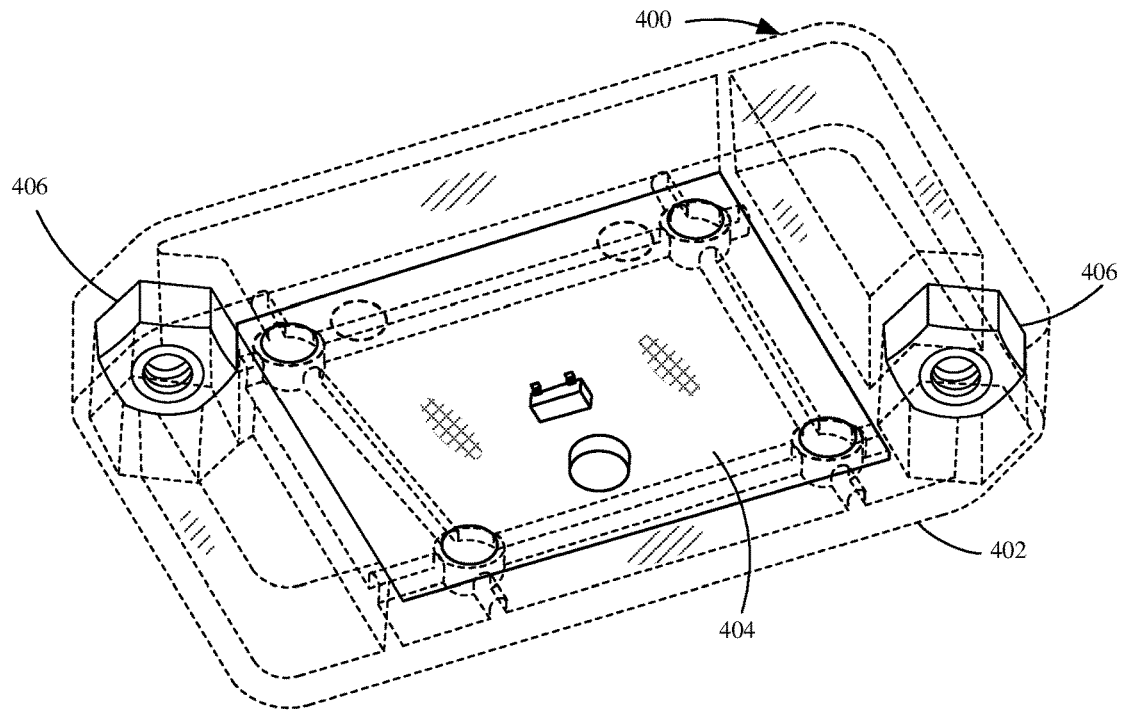
FIGS. 4A-C are views of an example sensor.
Figure 4B:
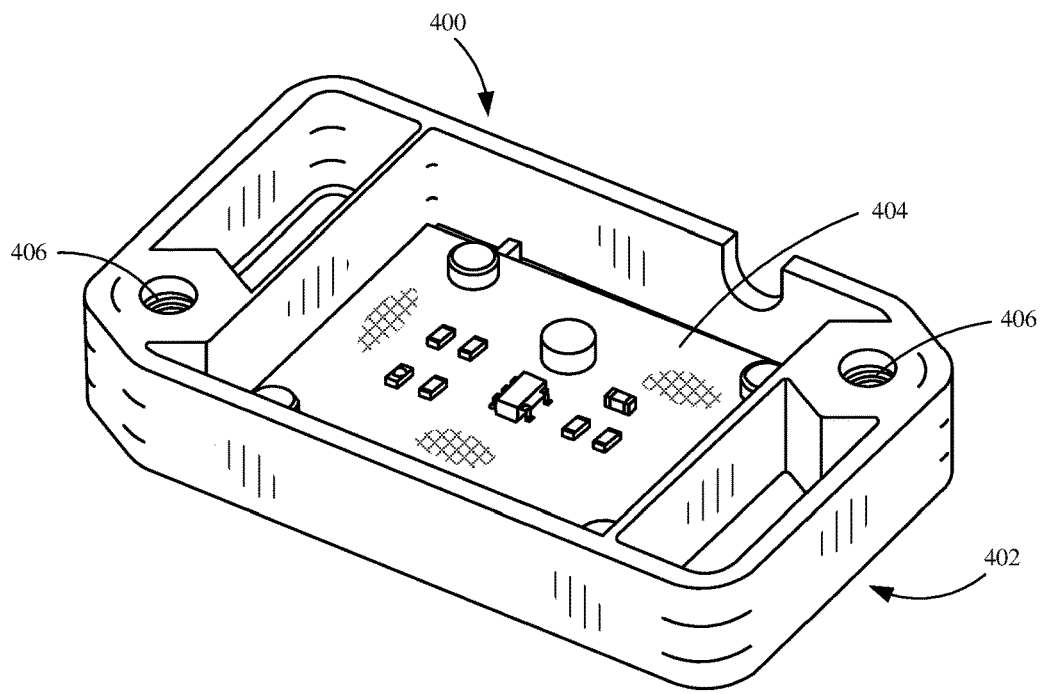

FIG. 4A is a perspective view of a sensor 400 (e.g., minimum sensor 204 and maximum sensor 206). Sensor 400 includes a potting body 402 that protects the electronic components within (e.g., circuitry 404). Potting body 402 can comprise include different types of fasteners 406 to allow sensor 400 to be mounted to a surface (e.g., an interior surface of the pump housing, such as shown in FIG. 2B). FIG. 4B is a cutaway view showing one example of sensor 400. Circuitry 404 can be seen in this view. Circuitry 404 can include a hall effect sensor, a magnet, communication circuitry, signal conditioning circuitry, etc.

Figure 4C:
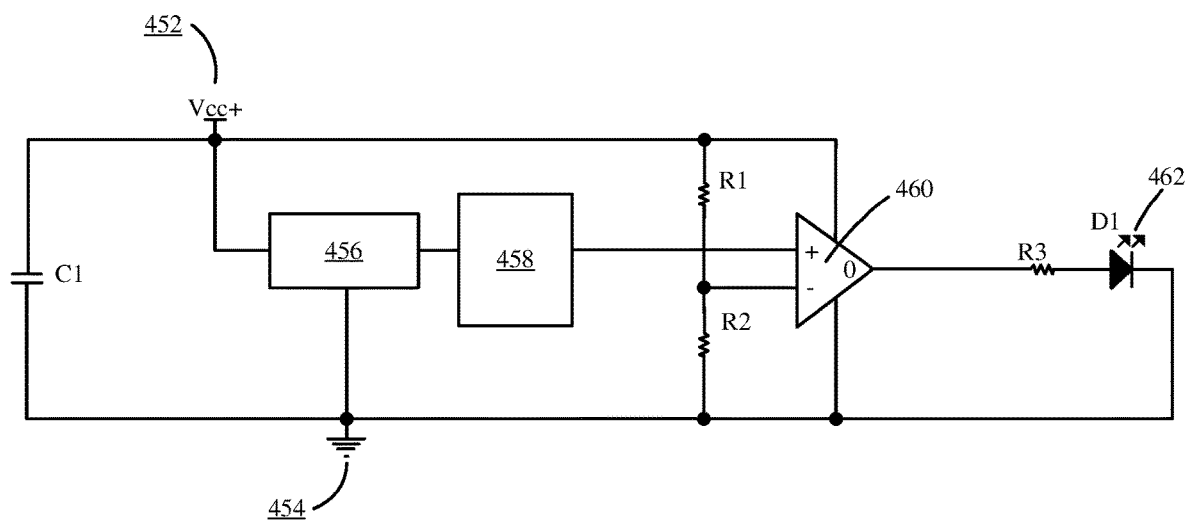

FIG. 4C is a circuit diagram showing one example of circuitry 404 from FIGS. 4A and 4B. Circuit 450 is powered by a power supply 452 and is grounded by a ground 454. Power supply 452 and ground 454 are functionally coupled to Hall effect sensor 456. Hall effect sensor 456 can include both a transducer and a magnet. The transducer measures an electromagnetic field generated by the magnet. When a ferrous metal comes into close proximity with the magnet, the magnetic field changes and is measured. Circuit 450 can optionally include a microcontroller 458. Microcontroller 458 can modify or process the signal generated by Hall effect sensor 456 in some way before being sent to comparator 460. Comparator 460 compares two voltages and generates an output voltage (normally in digital form).

Circuit 450 generates an output at output 462 that can be read by another computing system. For instance, output 462 is used by pump controller 140 to determine that the pump piston is at a maximum or minimum position (depending on which sensor is generated the output). Based on output 462 controller 140 can actuate solenoid to the opposite position. Output 462 can include some form of communication circuitry (e.g., wireless or wired communication components)

Figure 5:
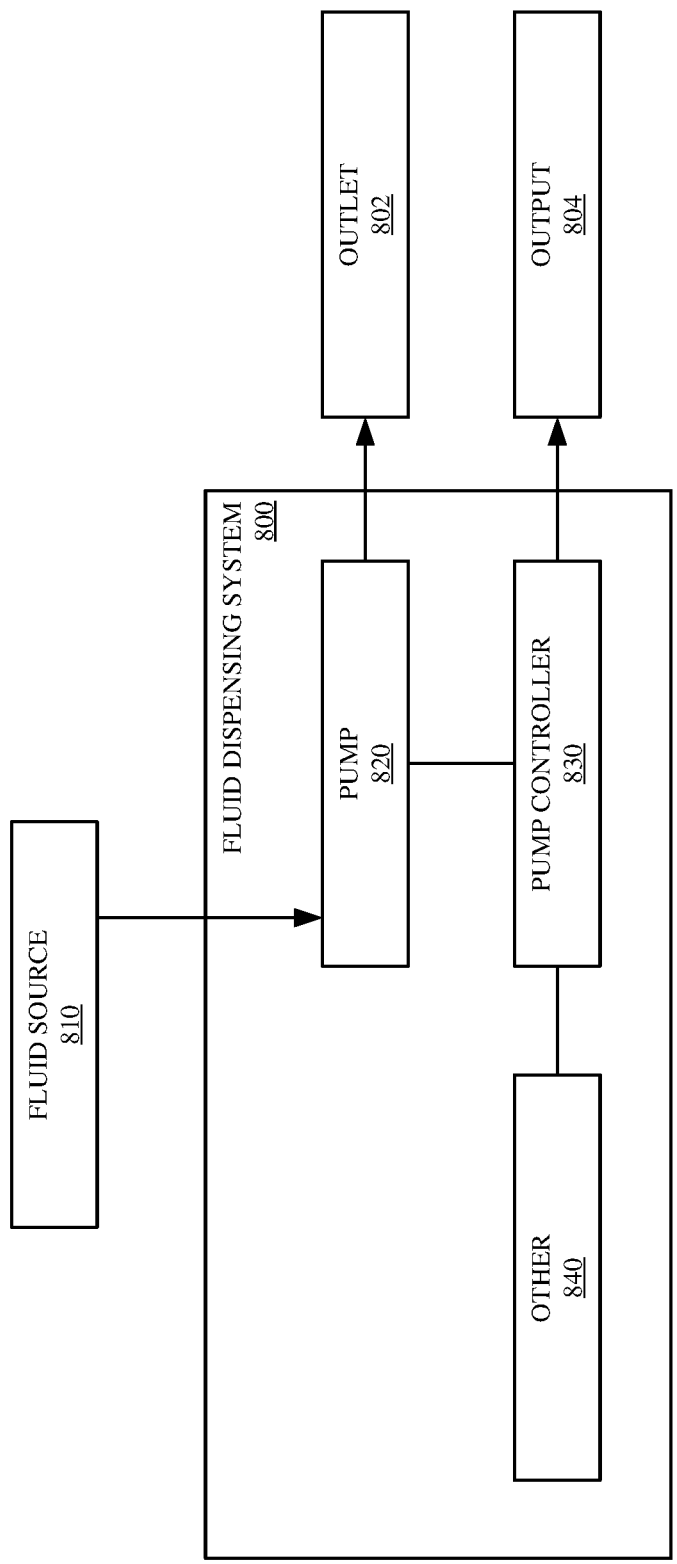
FIG. 5 is a block diagram showing an example liquid dispensing system

FIG. 5 is a block diagram showing one example of a liquid dispensing system. Fluid dispensing system 800 may be useful, for example, for dispensing paint, or other exemplary fluids such as primers, coatings, plural components, etc. System 800 may comprise a fluid source 810 operably coupled to a pump 820 within fluid dispensing system 800. Pump 820 is operably coupled to a pump controller 830. Pump 820 may be configured to pressurize, or otherwise deliver fluid from fluid source 810 to an outlet 802. Controller 830 may be configured, in one example, to provide an output 804. In one example, output 804 comprises storing detected parameters concerning operation of pump 820 in a memory of controller 830. In another example, output 804 comprises delivery of detected parameters to a separate unit, for example downloading detected parameter information to a separate computing unit. In another example, output 804 comprises an audio or visual output, for example an audible alert or a visual indication, such as a separate display unit. Fluid dispensing system 800, in some examples, comprises other features 840 integral to the delivery of fluid from fluid source 810 to outlet 802. For example, in an example where a fluid is delivered at a set temperature, other functionality 840 comprises a heater. Additionally, in some examples, fluid may be transferred a significant distance from pump 820 to outlet 802. Other functionality 840 may comprise a transport mechanism in such examples.

Figure 6:
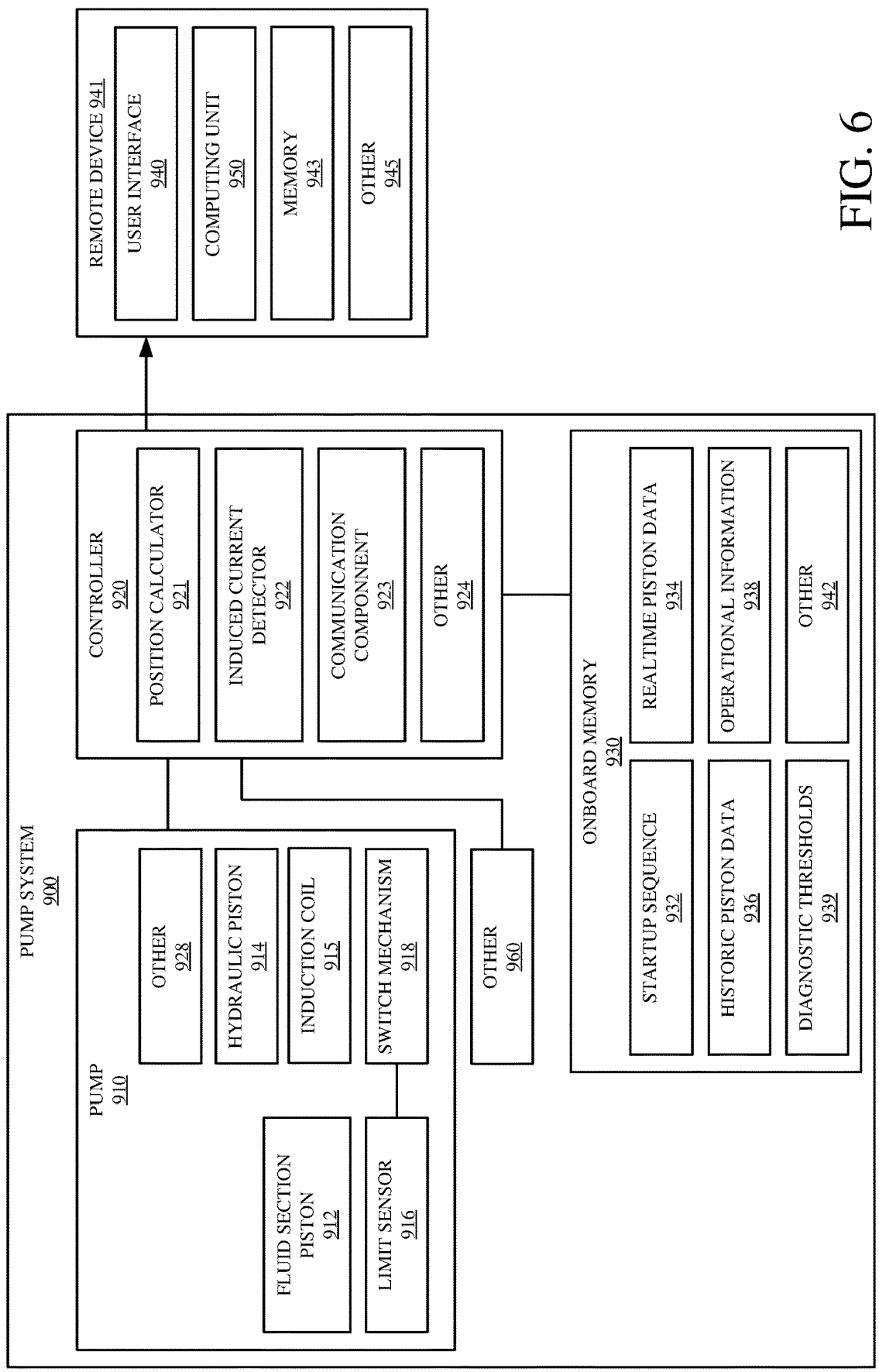
FIG. 6 is a block diagram showing an example pump system control.

FIG. 6 is a block diagram showing one example of a pump control system. Pump 910 includes, a fluid section piston 912 coupled to a hydraulic piston 914. Movement of hydraulic piston 914 is limited, by one or more switching mechanisms 918. Switching mechanisms 918 may include hall effect sensors, for example. However, other switching mechanisms 918 may also be used. For example, an integrated software controller 920 may be configured to control a solenoid. Pump 910 may also include one or more limit sensors 916. Limit sensors 916 may set the stroke limit for fluid section piston 912. Fluid section piston 912 may also comprise a magnet 913. Magnet 913 may, as it passes induction coil 915, induces a current that can charge, or provide power to, limit sensor 916. Pump 910 may also comprise other components 928.

Controller 920, illustratively is configured to operably control and monitor pump 910. Controller 920, can include an induced current detector 922 configured to detect a position of fluid section piston 912 prior to operation of pump 910. Induced current detector 922 may receive signal indicating a detected current associated with magnet 913 passing induction coil 915. Controller 920 also comprises a position calculator 921 configured to calculate a real-time position of piston 912, based on the integral/derivative of a calculated velocity (e.g., as shown in FIG. 8B), and the known stroke limits. Controller 920 also comprises a communication component 925 configured to communicate detected induced current, piston velocity and calculated position, to a remote device 941. Controller 920 may also comprise other functionality 924.

During a normal operational cycle, controller 920, can be responsible for controlling movement of fluid section piston 912 within a cylinder. For example, as fluid section piston 912 moves toward an end of a stroke, limit sensor 916 can send an indication, to detector 922, causing the controller to switch the direction of piston movement, for example using switching mechanism 918. Switching mechanism 918 can include a solenoid coupled to the controller. In another example, switching mechanism 918 comprises a solenoid coupled to a MOSFET and a flip-flop integrated circuit system.

Limit sensor 916 as illustrated above, with respect to other figures, includes a hall-effect sensor. In another example, limit sensor 916 comprises a mechanical sensor. In another example, limit sensor 916 comprises a base active transducer sensor. In another example, limit sensor 916 comprises an eddy-current sensor. In another example, limit sensor 916 comprises an inductive position sensor. In another example, limit sensor 916 comprises a proximity sensor. However, other suitable limit sensors 916 are also envisioned. For example, in one example, limit sensor 916 comprises an anisotropic magneto-resistive (AMR). In another example, limit sensor 916 comprises a giant magneto-resistive (GRM) magnetic sensor.

Traditionally, power is provided to sensor 916, and communication between sensor 916 and controller 920 is accomplished through a wired connection. With the advent of wireless communication, the ability to send wireless signals between controller 920 and sensor 916 becomes easier. However, a wireless charging mechanism is also needed to eliminate the wired connection. It may be desirable to remove the wired connection completely in order to reduce the risk of damage to the system. Power to sensor 916 can be provided by magnet 913 passing induction coil 915 and inducing a current. In one example, induction coil 915 comprises copper wire. However, other suitable materials are also envisioned.

Controller 920 may be coupled, in one example, to a memory 930. Memory 930 is illustratively shown as part of pump system 900. However, in another example, at least some portions of memory 930 are stored remotely from pump system 900. For example, a start-up sequence 932 may be stored within an integrated memory coupled to controller 920 such that controller 920 can retrieve sequence 932 and engage pump 910. Additionally, real-time piston data 936 may be transferred by controller 920 to onboard memory 930, and/or to remote device memory 943. Current operational information 938 may be downloaded and compared to historic piston data 936 to track operational parameters related to operation of pump 910 over time. Onboard memory 930 may also comprise diagnostic thresholds for detecting and identifying operational issues with the pump system. As illustrated in FIG. 8B, abnormal piston behavior may include irregular velocity patterns, as well as detecting velocity outside the norm—e.g., traveling too fast on the downstroke, or too slow on the upstroke. Memory 930 may also comprise other functionality 942.

Pump system 900 may communicate with a remote device 941, which can include a user interface 940, computing unit 950, memory 943 and other functionality. Remote device 941 can include a display associated with pump system 900, or a remote device, such as a mobile control in communication with controller 920 through communication component 925. User interface 940 may allow an operator to interact with controller 920. User interface 940 may include an input/output mechanism, such as a set of buttons, keys, etc. Remote device 941 may also comprise a separate computing unit 950.

Pump system 900 may also comprise other functionality 960, for example a heating mechanism to heat a fluid prior to delivery to an outlet, or a transport mechanism configured to transport pressurized fluid to an outlet.

Figure 7:
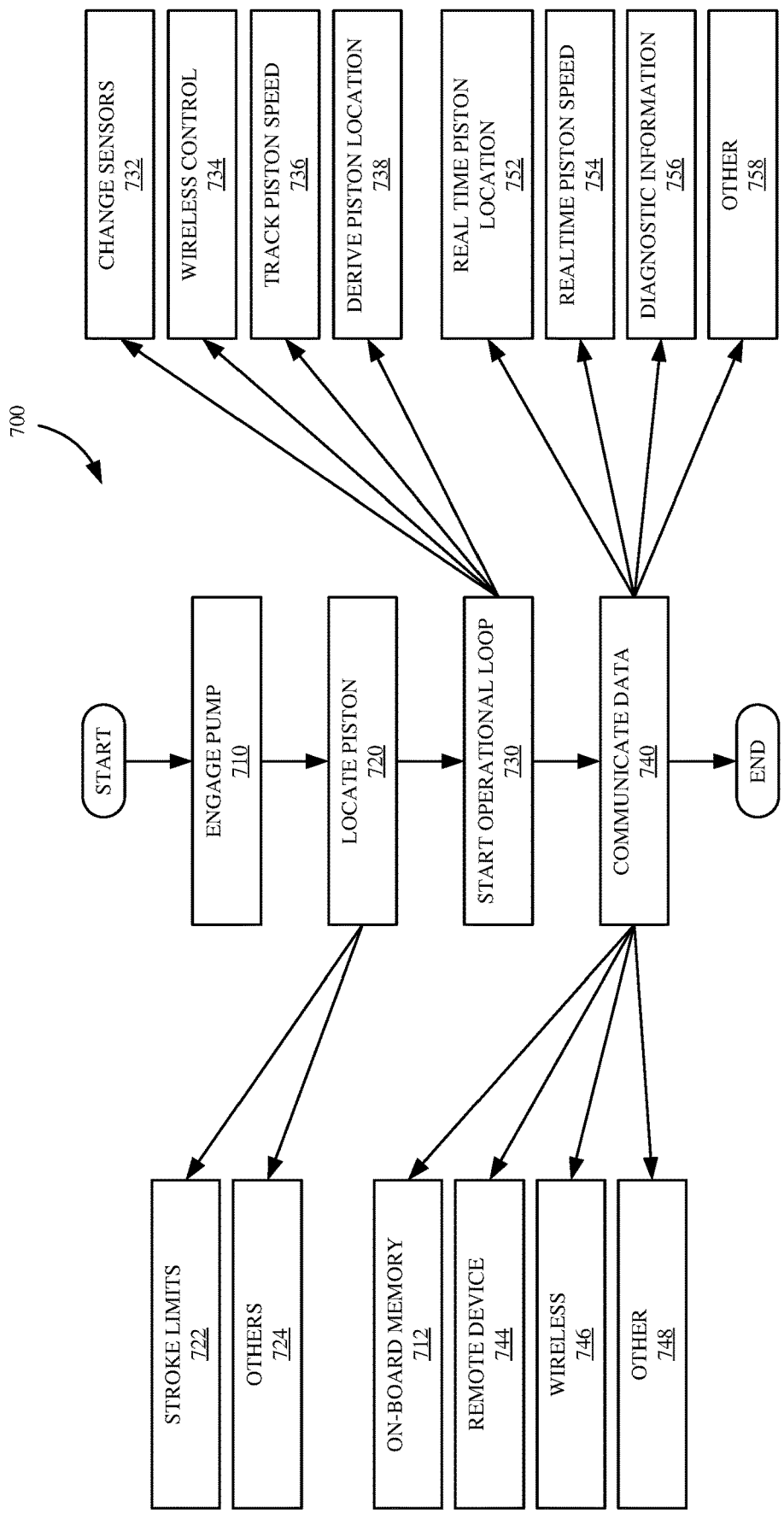
FIG. 7 is a flow diagram showing an operation of a pump system with a self-charging and limit sensing system in one example.

FIG. 7 is a flow diagram showing of an example operation of a pump control system.

In block 710, a pump system is engaged. Engaging the pump system may comprise turning on an associated motor (e.g., motor 136), initiating priming operations, and/or other appropriate start-up operations.

In block 720, a piston position is located within an operational stroke cycle. A controller, knowing the location of a piston, may be able to start a normal operational loop from the present location, instead of having to estimate a position. Additionally, once a piston is located, knowing stroke limits 722 allows for a controller to determine real-time piston positioning throughout the operational cycle. Other information 724 may also be detected at start-up, for example a charge status of the limit sensors, etc.

In block 730, an operational loop is started. Operation of the pump system may provide a source of power to a limit sensor, for example as a magnet coupled to a fluid piston passes an induction coil and induces a current, which charges sensors directly or indirectly (e.g., charging a battery coupled to the sensors), as indicated in block 732. Another example of charging the battery could be a thermoelectric cooler (e.g., Peltier cooler) that can use heat generated by the hydraulic system to charge the sensors. The operational loop may also include wireless control, as indicated in block 734, of a limit sensor by a controller. Starting an operational loop may also include detecting and tracking a piston velocity, as illustrated in block 736, based on detected induced current. Using the piston velocity profile, the real-time position of the piston can be derived, as indicated in block 738.

In block 740, data regarding the operational loop is communicated. Communication of operational loop data may include storing the data in an onboard memory 742, or sending to a remote device 744. In one example, data is communicated wirelessly 746. Other information may also be communicated and stored.

Communicated data can include real-time piston location throughout an operation, as indicated in block 752. Additionally, real-time piston velocity can be communicated, as indicated in block 754, in addition to, or instead of, a detected induced current. Diagnostic information may also be conveyed, as indicated in block 756, for example as abnormal behavior is detected.

While the description of various examples have been presented based on the use of induction-based charging, it is also envisioned that other self-charging systems can be used. For example, in one example, the hydraulics of the system generate heat, which is converted back to electricity using a thermoelectric generator, which then charges the battery of the sensor.

Figure 8A:
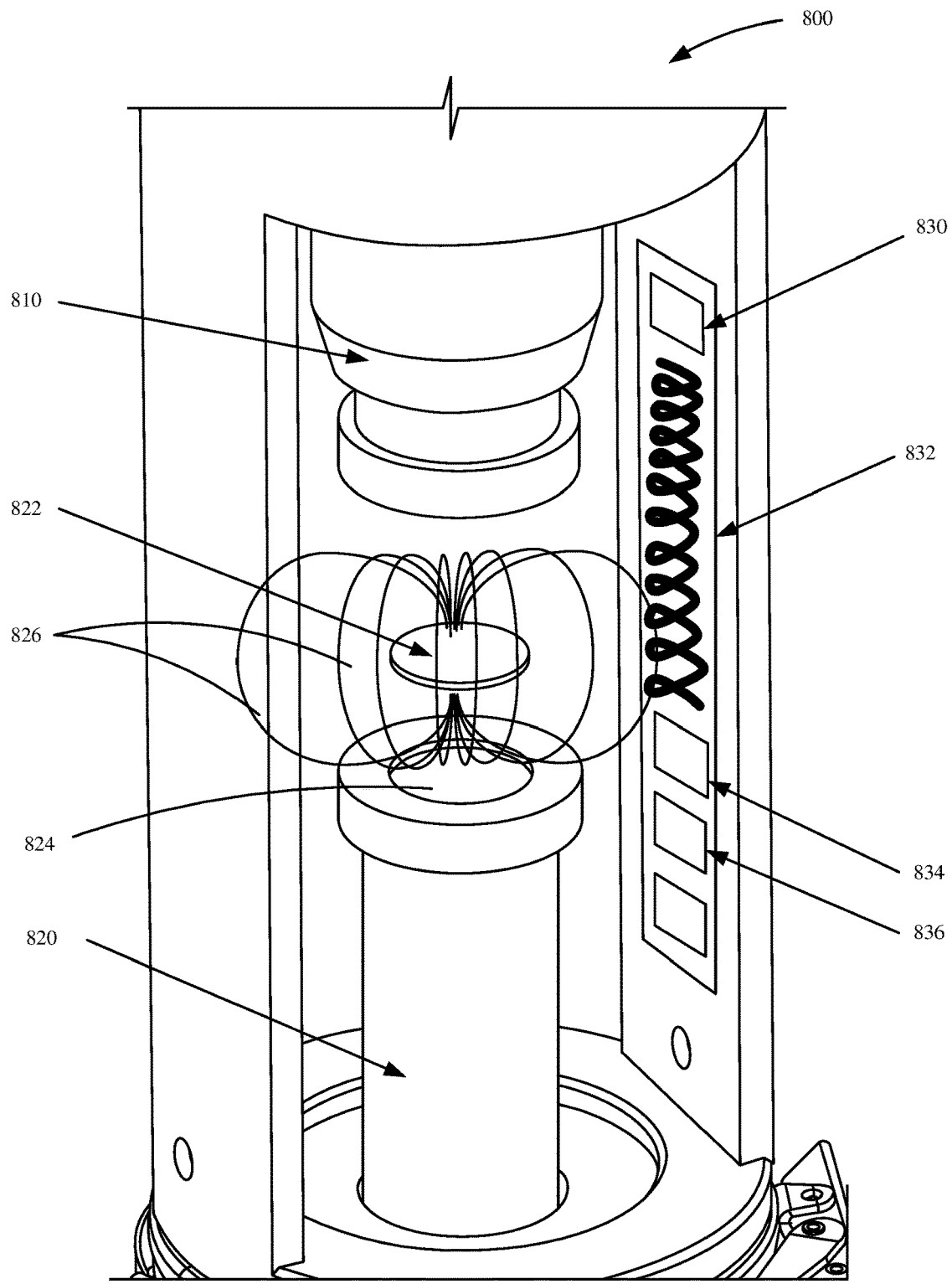
FIG. 8A is a close-up view of a self-charging sensor system for a pump assembly in one example.
Figure 8B:
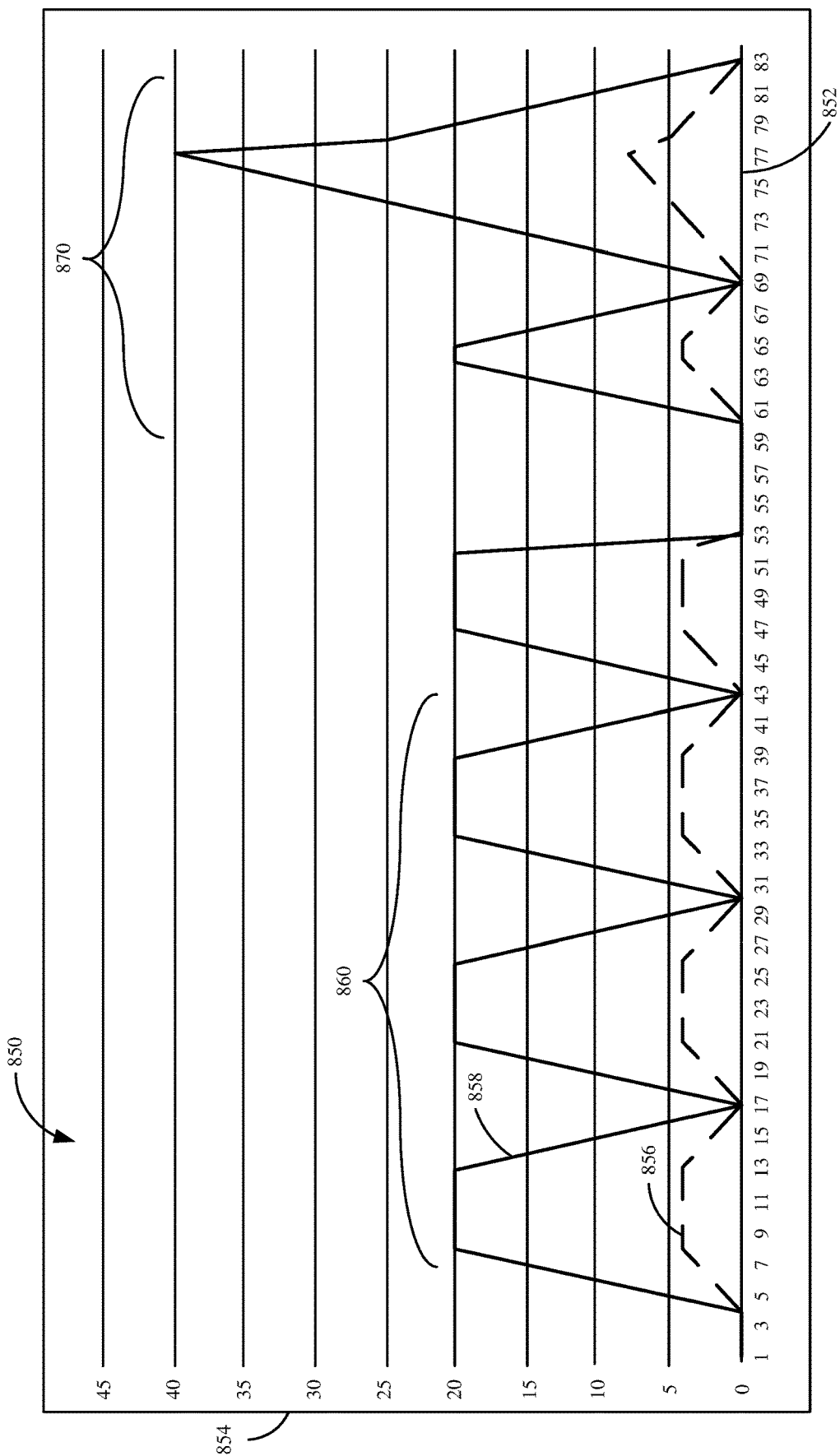
FIG. 8B is a chart showing an output of induced current and piston velocity over time in one example.

FIG. 8A is a close-up view showing one example of a self-charging sensor. A pump system may, in one example, have a sensor system 800 at the coupling between hydraulic piston 800 and fluid piston 820. Magnet 822 is attached to fluid piston 820 in a recess 824. In one example, magnet 822 has a smaller diameter than the fluid piston. Systems described herein may allow for more smaller magnets to be used.

Magnet 822 is configured to generate a magnetic field 826 that induces a current as piston 820 passes induction coil 832. The generated current can be used to charge sensor 830. In one example, sensor 830 is a hall effect sensor. In another example sensor 830 is a giant magnetoresistive (GMR) sensor. Sensor 830 can be initially powered by battery 834, with sustaining charge provided throughout an operation by magnet 822 passing induction coil 832 during each stroke.

System 800 also includes a communication module 836. In one example, communication module 836 is a wireless communication module with a computer processing unit (CPU). Communication module 836 can be configured to communicate directly with a pump controller, in one example. In another example, communication module 836 is configured to communicate directly with a remote device. For example, a user may receive reports through a mobile application, or other display, on the health of the pump.

FIG. 8B is a chart showing one example of a sample output of induced current and piston velocity over time in accordance with an example of the present invention. Output 850, as illustrated, is a graph of induced current 856 and piston velocity 858 over time. As shown in the graph, velocity is proportional to induced current. Calculating an integral of the velocity curve 858, in conjunction with known stroke limits, allows for instantaneous calculation of piston position.

Output 850 is also useful for detecting potential issues with a pump's operation. One mechanism for detecting issues with the pump before a potential failure occurs, prevent damage to the pump or components. Additionally, in the case where the pump is part of a plural component system, detecting when a pump is moving faster or slower than expected is important to maintain a desired ratio between the two components. As illustrated in output 850, normal piston behavior 860 can be distinctly identified from abnormal piston behavior 870. In one example, a controller is configured to detect a change between normal and abnormal behavior and generate an alert. The alert may be a visual alert (e.g., shown on a display of the system, a mobile device, etc.), an audio alert (e.g., an alarm), a physical alert (e.g., a vibration), or another suitable alert.

The descriptions of the various examples of the present disclosure have been presented for purposes of illustration, but are not intended to be exhaustive or limited to the examples disclosed. Many modifications and variations will be apparent to those of ordinary skill in the art without departing from the scope and spirit of the described examples. The terminology used herein was chosen to explain the principles of the examples, the practical application or technical improvement over technologies found in the marketplace, or to enable others of ordinary skill in the art to understand the examples disclosed herein.

What is claimed is:
1. A liquid delivery system comprising:
a source of hydraulic fluid;

a hydraulic cylinder fluidically coupled to the source of hydraulic fluid and having a hydraulic piston movable between a first limit position and a second limit position;

a rod connected to the hydraulic piston and extending out of the hydraulic cylinder;

a liquid cylinder comprising a liquid piston, operably driven by the rod, to pump a liquid along a flow path to a fluid applicator;

a housing assembly disposed between the hydraulic cylinder and the liquid cylinder, the housing assembly including a first wall and a second wall that are spaced apart to define a first opening and a second opening;

a sheath and a collar which are disposed within the housing assembly and couple the liquid piston to the rod, wherein at least one of the sheath or the collar comprises a ferrous metal;

a sensor device disposed entirely within the housing assembly and located outside the hydraulic cylinder, the sensor device comprising a potting body that hermitically seals a magnet therein, and the sensor device configured to generate a sensor signal indicative of a sensed position of the at least one of the collar or the sheath comprising the ferrous metal;

a controller configured to:
derive a position of the hydraulic piston based on the sensor signal; and
based on the position of the hydraulic piston, actuate a solenoid valve to control a flow of the hydraulic fluid between from the source of hydraulic fluid and the hydraulic cylinder;

a first cover configured to couple to the first wall and cover the first opening; and a second cover spaced apart from the first cover and configured to couple to the second wall and cover the second opening.

2. The liquid delivery system of claim 1 wherein the liquid comprises paint.

3. The liquid delivery system of claim 1, wherein the sheath is cylindrical.

4. The liquid delivery system of claim 1, wherein the first opening and the second opening are on opposite sides of the collar.

5. The liquid delivery system of claim 1, wherein the sensor device is directly mounted to an interior side of one of the first wall or the second wall.

6. The liquid delivery system of claim 1 wherein the sensor device comprises a first sensor device corresponding to the first limit position and configured to generate a first sensor signal indicative of a first sensed position of the at least one of the collar or the sheath, the liquid delivery system further comprising:
a second sensor device corresponding to the second limit position and located outside the hydraulic cylinder, the second sensor device configured to generate a second sensor signal indicative of a second sensed position of the at least one of the collar or the sheath.

7. The liquid delivery system of claim 6, wherein the first cover and the second cover are removable to provide access to an interior of the housing assembly.

8. The liquid delivery system of claim 7, wherein the first sensor device and the second sensor device are directly coupled to an interior wall of the housing assembly, the interior wall of the housing assembly being separate from the first cover and the second cover such that the first sensor device and the second sensor device remain disposed on the interior wall of the housing assembly when the first cover and the second cover are removed.

9. The liquid delivery system of claim 8, wherein a potting body of the first sensor device comprises fasteners disposed within the potting body of the first sensor device and configured to facilitate coupling of the first sensor device to the interior wall of the housing assembly, and wherein a potting body of the second sensor device comprises fasteners disposed within the potting body of the second sensor device and configured to facilitate coupling of the second sensor device to the interior wall of the housing assembly.

10. The liquid delivery system of claim 1, wherein the sensor device comprises a wireless communication component configured to wirelessly transmit the sensor signal.

11. The liquid delivery system of claim 10 wherein the sensor device is coupled to a battery power source.

12. A paint delivery system comprising:
a piston pump assembly including:
a source of hydraulic fluid;
a hydraulic cylinder coupled to the source of hydraulic fluid and having a piston movable between a first limit position and a second limit position;
a rod connected to the piston and extending out of the hydraulic cylinder;
a solenoid valve configured to control a flow of a hydraulic fluid between the source of hydraulic fluid and the hydraulic cylinder;
a housing structure coupled to the hydraulic cylinder, the housing structure including a first wall and a second wall that are spaced apart to define a first opening and a second opening;
a paint pump coupled to the piston by a collar assembly to move paint from a paint reservoir to a paint applicator, the collar assembly disposed within the housing structure and including:
a collar; and
a sheath,
wherein at least one of the collar or the sheath comprises a ferrous material; and
a first non-contact sensor device comprising a first potting body that hermitically seals a first magnet therein, the first non-contact sensor device corresponding to the first limit position and configured to generate a first sensor signal indicative of a first sensed position of the at least one of the collar or the sheath, the first non-contact sensor device disposed entirely within the housing structure and located outside the hydraulic cylinder;
a second non-contact sensor device comprising a second potting body that hermitically seals a second magnet therein, the second non-contact sensor device corresponding to the second limit position and configured to generate a second sensor signal indicative of a second sensed position of the at least one of the collar or the sheath, the second non-contact sensor device disposed entirely within the housing structure and located outside the hydraulic cylinder;
a controller configured to derive a position of the piston based on first sensor signal or the second sensor signal;
a first cover configured to couple to the first wall and cover the first opening; and
a second cover spaced apart from the first cover and configured to couple to the second wall and cover the second opening.

13. The paint delivery system of claim 12, wherein the controller is configured to receive the first sensor signal and the second sensor signal and to control the solenoid valve based on the first sensor signal or the second sensor signal.

14. The paint delivery system of claim 12, wherein the first non-contact sensor device is directly mounted to an interior side of one of the first wall or the second wall, and wherein the second non-contact sensor device is directly mounted to the interior side of the one of the first wall or the second wall.

15. The paint delivery system of claim 12, wherein the first opening and the second opening are on opposite sides of the collar assembly.

\* \* \* \* \*